United States Patent [19]
Hoffman et al.

[11] Patent Number: 5,473,408
[45] Date of Patent: Dec. 5, 1995

[54] HIGH-EFFICIENCY, ENERGY-RECYCLING EXPOSURE SYSTEM

[75] Inventors: Jeffrey M. Hoffman, Stamford, Conn.; Kanti Jain, Briarcliff Manor, N.Y.

[73] Assignee: ANVIK Corporation, Elmsford, N.Y.

[21] Appl. No.: 269,670

[22] Filed: Jul. 1, 1994

[51] Int. Cl.⁶ .................................................... G03B 27/42
[52] U.S. Cl. ................................ 355/53; 355/71; 359/503
[58] Field of Search ........................ 355/53, 71; 359/505, 359/503

[56] References Cited

U.S. PATENT DOCUMENTS

| | | | |
|---|---|---|---|
| 4,881,231 | 11/1989 | Jain | 372/32 |
| 4,924,257 | 5/1990 | Jain | 355/53 |
| 4,960,468 | 10/1990 | Sinton et al. | 136/259 |
| 4,991,962 | 2/1991 | Jain | 356/349 |
| 5,059,013 | 10/1991 | Jain | 359/503 |
| 5,285,236 | 2/1994 | Jain | 355/53 |
| 5,291,240 | 3/1994 | Jain | 355/53 |
| 5,357,312 | 10/1994 | Tounai | 355/67 |

*Primary Examiner*—Russell E. Adams
*Assistant Examiner*—D. P. Malley
*Attorney, Agent, or Firm*—Carl C. Kling

[57] ABSTRACT

A system is described for recycling radiation reflected by an illuminated patterning mask in a via-hole drilling or exposure tool. The mask is illuminated by high-energy laser radiation, and the illuminated region is imaged onto a substrate by a projection, proximity, or contact method. The source radiation is suitably shaped by a lens assembly and focused into an optical intensity homogenizer with the desired numerical aperture. The homogenizer has the base function of converting the focused beam to self-luminous light required for drilling of via-holes or other processes accomplished by the tool, while maintaining the numerical aperture of the beam. The homogenizer also participates in the radiation-recycling function. An apertured reflector allows radiation from the source to enter the homogenizer. The radiation passing through and exiting the homogenizer is image by a lens to illuminate a portion of the mask. Radiation incident on transparent areas of the mask coming propagates to the substrate, but radiation incident upon reflective regions of the mask coating is reflected back into the homogenizer. The apertured reflector at the entry port of the homogenizer has a reflective back surface which returns the majority of the light re-entering the homogenizer to the patterning mask. The effective illumination intensity is greatly increased by the recycling of the back-reflected radiation, allowing for a reduction in source power or decrease in exposure time for the drilling of via-holes or other exposure processes.

30 Claims, 5 Drawing Sheets

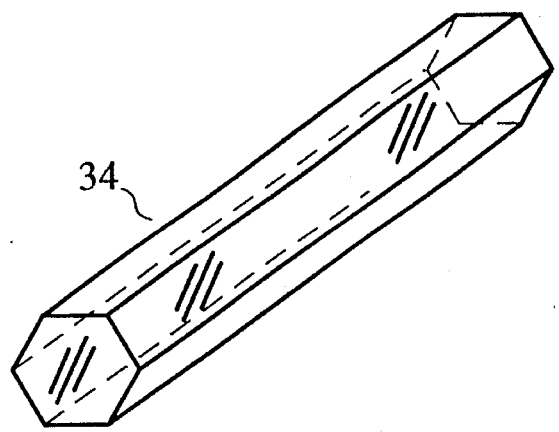
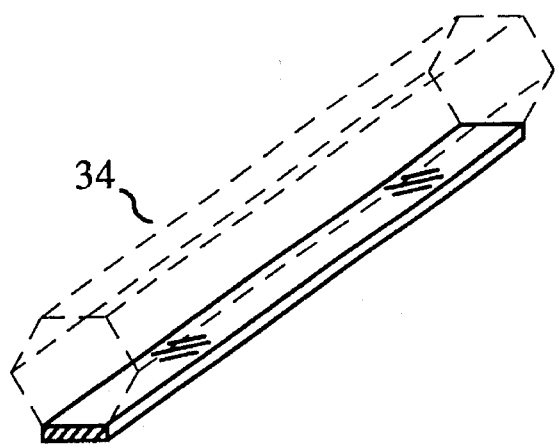
Fig. 10        Fig. 11
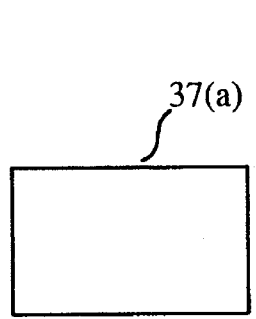
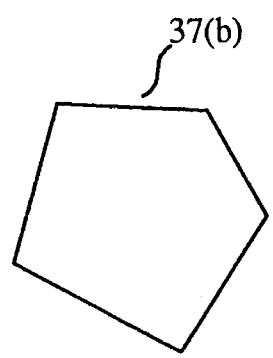
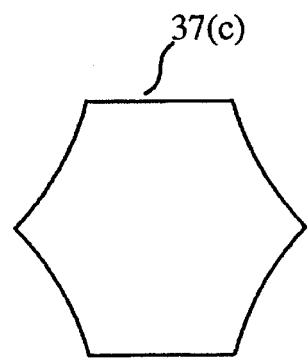
Fig. 12(a)        Fig. 12(b)        Fig. 12(c)

HIGH-EFFICIENCY, ENERGY-RECYCLING EXPOSURE SYSTEM

BACKGROUND OF THE INVENTION

1. Field of the Invention

This invention relates to imaging systems for creating a desired pattern on a radiation-sensitive substrate such as those used in microelectronics circuits and boards, and more particularly relates to an energy-recycling imaging system useful as a high-speed precision manufacturing tool for creating a desired pattern, such as via-holes in electronic modules.

2. Description of Related Art

Large-area lithographic exposure systems are required as production tools for the manufacturing of numerous products, including multi-chip modules for high-density electronic packaging, flat-panel displays, printed circuit boards, and semiconductor integrated circuits. Many types of exposure systems are used in the industry, such as contact and proximity tools, projection imaging tools, and direct-write tools. Such systems are often referred to as patterning tools or photolithographic systems.

Of these, the most desirable exposure systems are the projection imaging tools because they provide non-contact imaging, large-area exposure capability, batch processing, and high throughputs. These typically include illumination, imaging, and motion control subsystems. Projection systems employing ultraviolet light sources, particularly excimer lasers, are especially attractive because they enable high-volume, cost-effective production.

Projection Systems for Via-Hole Drilling: General Remarks

In a projection exposure system an imaging lens assembly creates a replica of an illuminated mask pattern on the product substrate. The pattern on the mask is defined by opaque and transparent regions. Light rays transmitted through the transparent mask regions are imaged on the work substrate, which is thus pattern-wise exposed; whereas light rays incident on the opaque mask regions are either absorbed or reflected.

In most production applications, such as imaging of circuit patterns in a photoresist, the loss of light as described above is of little consequence, particularly when (a) the transparent regions comprise a significant portion of the mask area, (b) the amount of light needed for exposure is sufficiently small, and (c) the light sources used are reasonably manageable in size.

However, in applications such as etching via-holes in inter-layer dielectric materials in the production of multi-chip modules, the entire exposure system, process, and mask are substantially different in several aspects. Here, the light source used is a large, high-power excimer laser, which is necessary for etching the via-holes by a photoablative process. The mask is made by depositing on a fused silica blank a high-reflectivity multilayer dielectric coating and then patterning it to create transparent and reflecting regions. The transparent regions are the areas that the excimer laser radiation goes through to etch via-holes in the substrate. The total area occupied by the via-holes as a fraction of the mask area is extremely small, typically 1% or less.

Thus, although the throughput of a mask-projection via-etching system, due to batch processing, is significantly greater than that of a direct-write system, it could be greatly enhanced if the excimer laser radiation reflected from the dielectric mask were utilized. The invention disclosed here achieves this objective with a high-efficiency, energy-recycling mechanism.

Large-area projection systems and related subsystems for illumination and alignment are described in the following U.S. Patents:

U.S. Pat. No. 4,924,257, Scan and Repeat High-Resolution Projection Lithography System, Jain, May 8, 1990;
U.S. Pat. No. 5,285,236, Large-Area, High-Throughput, High-Resolution Projection Imaging System, Jain, Feb. 8, 1994;
U.S. Pat. No. 5,059,013, Illumination System to Produce Self-Luminous Light Beam of Selected Cross-Section, Uniform Intensity, and Selected Numerical Aperture, Jain, Oct. 22, 1991;
U.S. Pat. No. 5,291,240, Nonlinearity Compensated Large-Area Patterning System, Jain, Mar. 1, 1994;
U.S. Pat. No. 4,991,962, High Precision Alignment System for Microlithography, Jain, Feb. 12, 1991; and
U.S. Pat. No. 4,881,231, Frequency-Stabilized Line-Narrowed Excimer Laser Source System for High-Resolution Lithography, Jain, Nov. 14, 1989.

SUMMARY OF THE INVENTION

Definitions

Means for recycling homogenizer radiation—Mechanisms associated with an optical homogenizer which reflect and re-reflect light for use in an imaging system Numerical aperture— A quantity used to specify the light-gathering power of an optical system, specifically the sine of the angular semi-aperture in the object space multiplied by the refractive index of the object space.

The invention provides significantly increased energy efficiency to a production tool for the drilling of microscopic via-holes which are useful in connecting together circuit patterns on various layers in multi-layer microelectronic circuit modules. It is the object of the invention to reduce the energy requirement of the imaging system by recapturing the radiation energy blocked by the masked (reflecting) portions of the patterning mask. Energy reflected by the highly reflective mask (typically 97% reflectivity) is recycled by collecting the reflected light with a special radiation-recycling homogenizer which accepts the reflected radiation, further processes for additional homogeneity, and returns the reflected radiation to the mask using a reflective aperture element in such a fashion as to effectively increase the radiation intensity of the illumination region on the mask. An advantage of the invention is that it permits the use of a less powerful laser as the primary producer of radiation in the imaging system, thus cutting costs of obtaining and operating the via-hole drilling tool.

Other objects, features and advantages will become apparent to those skilled in the art from the description of a preferred embodiment, and from the drawings, described in the following section.

DRAWINGS

FIG. 1 is a schematic presentation of the invention.

FIGS. 2(a) and 2(b) together form an operation diagram used for discussion of light ray patterns in the embodiment shown in FIG. 1.

Figure 5A:
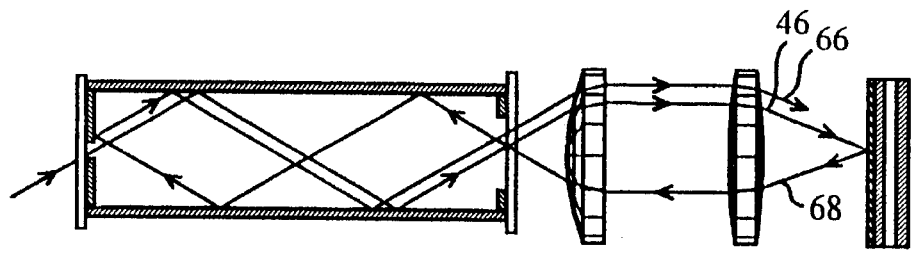
Figure 5B:
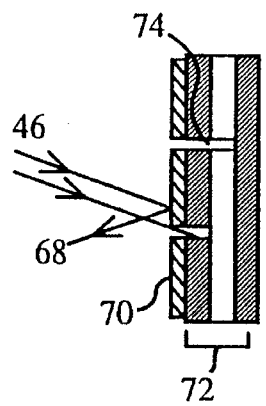

FIGS. 5(a) and 5(b) together form an operation diagram describing the use of an in-situ mask coated on the substrate rather than a projection mask.

FIG. 5(b) is enlarged to show additional detail.

Figure 6A:
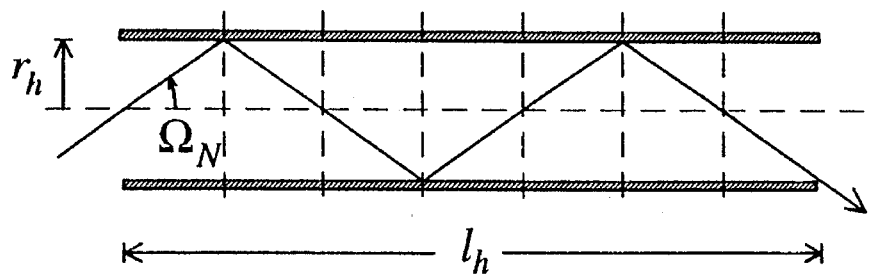
Figure 6B:
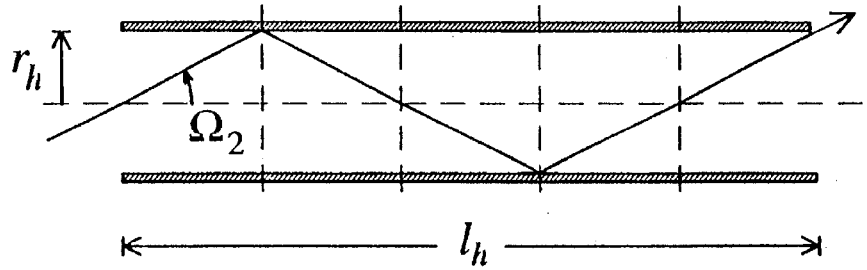

FIG. 6(a) is a diagram used for geometrical analysis of the homogenizer input showing the maximum numerical aperture for the case of N internal reflections. FIG. 6(b) illustrates the case of two internal reflections.

Figure 3:
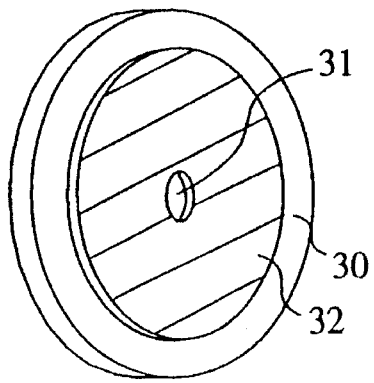
FIG. 3 is a detailed back view of the reflective homogenizer input apertured reflector which has a central aperture that allows the radiation from the source to enter the homogenizer and a reflective surface surrounding the aperture that reflects radiation returned to the homogenizer by the reflective portions of the mask.
Figure 7A:
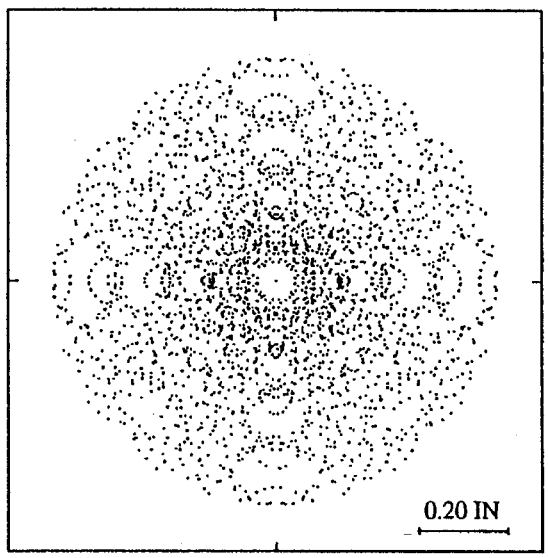
Figure 7B:
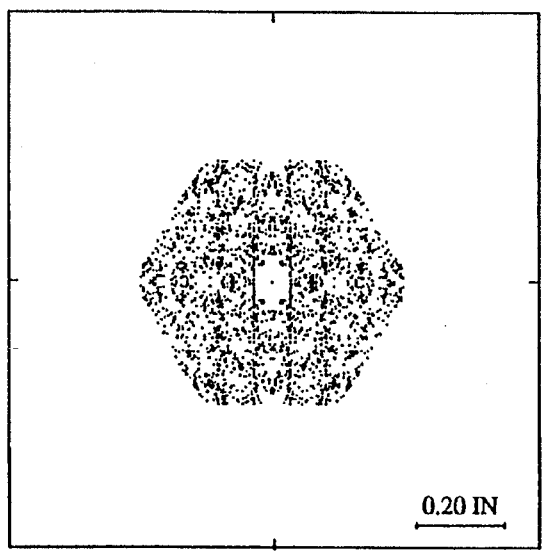

FIG. 7(a) shows the pattern of ray intersections on the reflective surface of the input aperture depicted in FIG. 3 for a set of rays that pass through the homogenizer and condenser lens, reflect once from the reflective mask coating and return back through the system to the input aperture. The case illustrated is for a one inch diameter circular homogenizer with a 0.4 inch radius circular aperture and allowing at most two reflections per pass. FIG. 7(b) shows the ray intersection pattern for a 8 mm-sided hexagonal homogenizer with a 0.8×0.8 inch square aperture, also allowing at most two reflections per pass.

Figure 8:
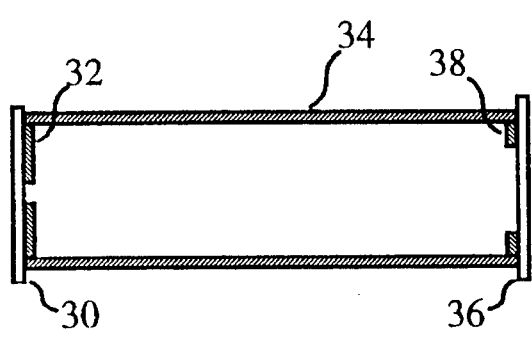

FIG. 8 shows homogenizer radiation recycling means.

Figure 9:
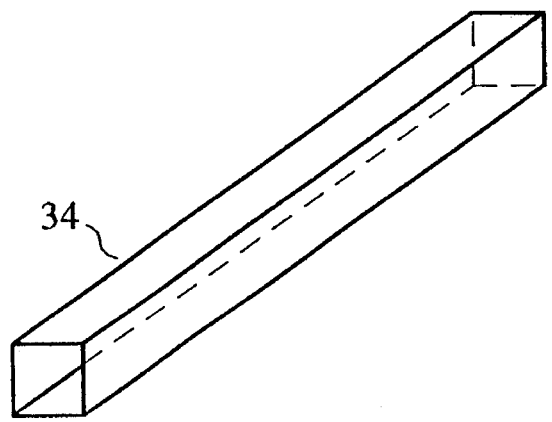

FIG. 9 shows an optical intensity homogenizer with square cross section.

FIG. 10 shows an optical intensity homogenizer having a solid piece of optically transparent material.

FIG. 11 shows an optical intensity homogenizer cylinder with multiple highly reflective mirror strips FIG. 12a shows a quadrilateral shape 31(a) for an optical intensity homogenizer cylinder aperture forming a radiation pattern.

FIG. 12b shows an irregular polygon shape 31(b) for an optical intensity homogenizer cylinder aperture forming a radiation pattern.

FIG. 12c shows a closed polygon made up of partially curved sides, for an optical intensity homogenizer cylinder aperture 31(c) forming a radiation pattern.

DESCRIPTION OF THE PREFERRED EMBODIMENT

Figure 1:
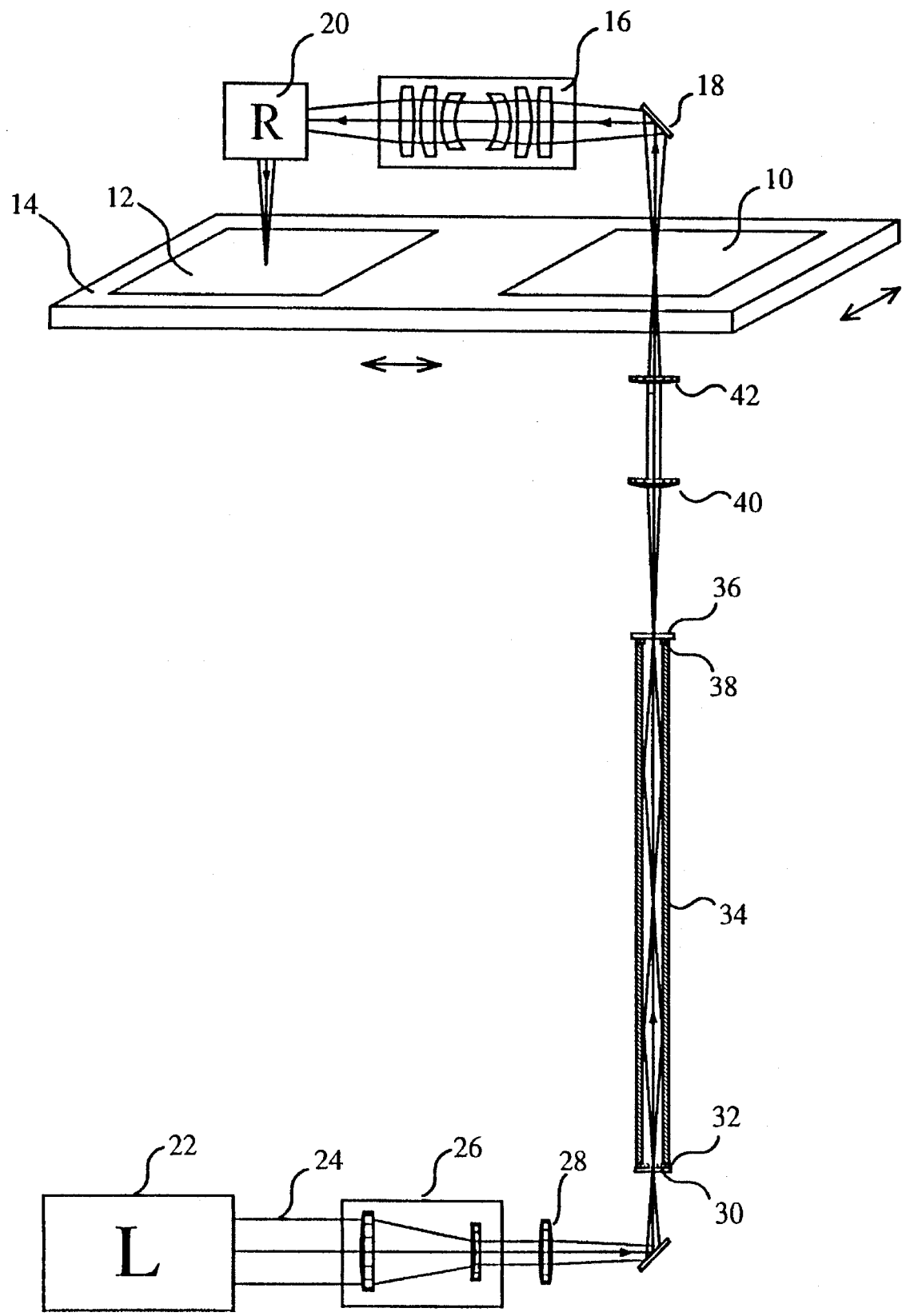

The high-efficiency, energy-recycling system is schematically illustrated in FIG. 1, as part of an imaging system optimized for use as a via-hole drilling production tool. The patterning mask 10 and substrate 12 are rigidly held on a planar scanning stage 14. A projection lens 16, in conjunction with redirecting mirror 18 and reversing unit 20, forms an image of a portion of the patterning mask 10 on the substrate 12. The stage 14 is scanned in x- and y- dimensions to image the entire mask pattern on the substrate 12.

The illumination for exposure is provided by a laser 22, from which beam bundle 24 is first suitably shaped by lens assembly 26 and then focused into an optical intensity homogenizer 34 by lens 28 with the desired numerical aperture. As shown by the earlier Jain patents, homogenizer 34 has the base function of converting the operating radiation from collimated light to self-luminous radiation desirable for the drilling of via-holes and other processes accomplished by the tool. In this invention, homogenizer 34 also participates in the radiation-recycling function. The homogenizer can use a hollow cylinder with one or more mirrored interior surfaces, or it may use a solid cylinder of optically transparent material, such as quartz, in which multiple reflections take place by total internal reflection. Further, the cross-section of the cylinder can be of any desired shape, such as hexagonal, square, or round.

A relay lens assembly, comprising elements 40 and 42, forms an image of the output plane of the homogenizer 34 on the patterning mask 10. Light rays which are incident on the mask in its transparent areas propagate to the substrate through the projection optical train (18, 16, 20), but those light rays which are incident on the mask in its reflective areas are reflected back toward the homogenizer. As shown in FIG. 1, and illustrated in detail in FIGS. 2(a) and 2(b), an aperture element 30 is used at the input end of the homogenizer with a highly-reflective inner surface 32 facing the output of homogenizer 34. The input aperture 30 allows the radiation from the laser source 22 to enter the homogenizer, through an opening or appropriate transparent region, and the reflective surface 32 captures a substantial portion of the reflected light from the mask and returns it to the mask.

FIG. 3 shows detail as a back view of the apertured reflector element 30 which allows the source radiation to enter the homogenizer through the transmitting optical or mechanical aperture 31, and reflective surface 32 which serves to reflect most of the llight received from the reflected portions of mask 10 back into the homogenizer 34.

Figure 4:
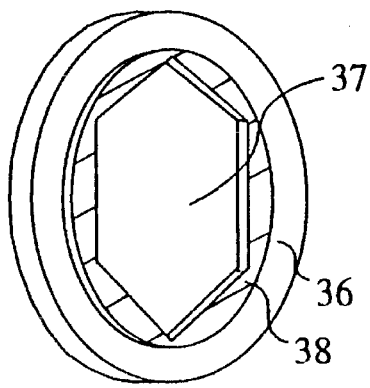
FIG. 4 is a detailed back view of the output aperture element which defines the selected light output pattern of the homogenizer and returns the vignetted portion of the light by reflection back towards the input aperture.

FIG. 4 shows detail as a front view of the pre-imaging homogenizer output aperture 36, which provides an exit pattern 37 for serf-luminous light from the homogenizer 34, and reflective regions 38 which serve to reflect into the homogenizer 34 the light vignetted by pattern 37.

FIGS. 5(a) and 5(b) show how an in-situ mask 70 on a layered substrate 72 can be used for via-hole drilling rather than a projection mask 10, with the same implementation of the invention for excess light capture and recycling. As in projection imaging, the majority of the area of the mask is reflective; only the tiny areas of the via-holes pass light.

Irrespective of whether the via-drilling system uses a projection mask or an in-situ mask, the light reflected from the mask is captured by homogenizer 34 and returned to the mask, with further homogenization, by the reflective surface 32 on aperture 30. In both configurations, the main requirement is that the mask have a high overall reflectivity.

In embodying the disclosed invention, reference may be made to imaging systems described in U.S. Pat. Nos. 4,924,257; 5,285,236; and 5,291,240; and an illumination system described in U.S. Pat. No. 5,059,013 by K. Jain.

FIGS. 8–11 and 12(a)–12(c) add alternative details of composition and configuration of homogenizer radiation recycling means, as follows:

FIG. 8 shows details of homogenizer radiation recycling means for homogenizer 34, featuring reflectivity of mask 48 material and reflective coating 32 within homogenizer 34 of FIGS. 1 and 2.

FIG. 9 shows a square cross-section for homogenizer 34 of FIGS. 1 and 2, as contrasted to the hexagonal cross-section or some other closed polygonal form cross-section.

FIG. 10 shows composition of optical homogenizer 34 of FIGS. 1 and 2 as a solid piece of optically transparent material.

FIG. 11 shows construction of an optical intensity homogenizer having multiple highly reflective internal mirror strips instead of internal mirrorization.

FIGS. 12(a), 12(b) and 12(c), respectively, show aperture patterns of quadrilateral shape 37(a), irregular polygon shape 37(b), and shape with partially curved sides 37(c), as contrasted to the hexagonal aperture pattern 37 of FIG. 4.

Operation

Figure 2A:
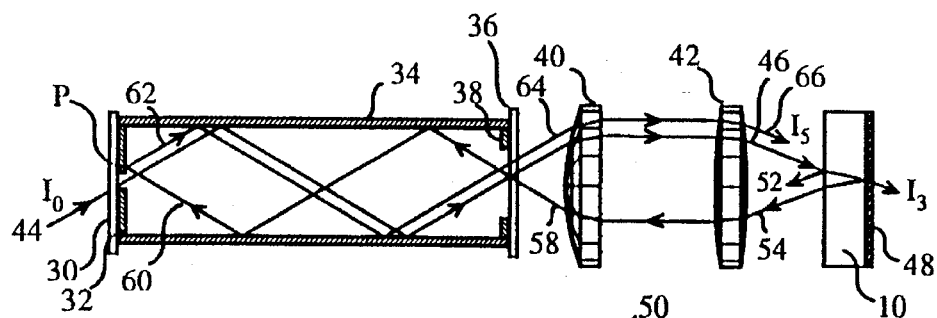
FIG. 2(b) is enlarged to show additional detail.
Figure 2B:
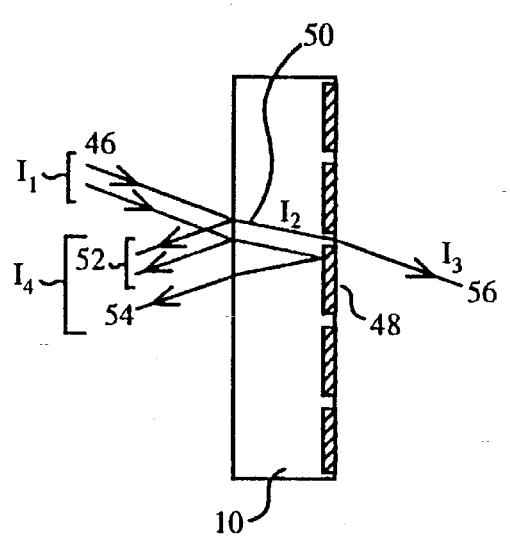

FIGS. 2(a) and 2(b) show a ray 44 from the laser 22, which enters the homogenizer 34, through input aperture 30. Ray 44 is homogenized by multiple reflections in homogenizer 34. Ray 44 is incident upon the mask as ray 46 and is partially reflected as reflected component 52 from the uncoated back surface of the patterning mask 10. The component of the incident radiation 46 transmitted by the uncoated mask surface strikes the reflective layer 48 of patterning mask 10, and except for negligible absorption and the small amount of rays actually used for via-hole drilling 56 (FIG. 2(b)), is reflected as component 54 by reflective layer 48. Those few rays 46 which strike the mask 10 in one of its few transparent regions (via-hole pattern) exit from the mask 10 as rays 56 with an intensity $I_3$. Both reflection components (52, 54) will be captured by the homogenizer 34 and returned to the mask 10 by the recycling mechanism.

Ray 46, thus, is reflected into two components; the first component is shown as my 52 reflected from the uncoated surface of the mask, and the second component is shown as ray 54 reflected from the reflective mask coating 48. These components are combined as ray 58 which enters back into the homogenizer 34 and strikes the reflective surface 32 of input aperture 30 as ray 60 at point P. The input aperture 30 is made large enough to permit all input rays from the source 22 focused near it on its input side to enter the homogenizer 34, and small enough to prevent the return towards laser 22 of most of the rays reflected from the mask 10. Ray 60, striking at point P, is reflected by reflective coating 32 as ray 62, exits the homogenizer as ray 64, and is again incident upon the mask 10 as ray 66. If ray 62 falls on a transparent region of the mask 10, it is utilized to expose the substrate 12, but if it falls on a reflecting region, the above sequence of steps is repeated. By optimizing the size of the aperture 30, most of the radiation reflected from the mask 10 can be re-utilized for exposure.

The laser radiation source 22 has a characteristic wavelength (for example, 308 nanometers). The need to avoid absorption by the optical elements and ghost reflections makes it important that the transmissive and reflective elements be suitably coated to provide maximum transmission or reflectivity, respectively, for the characteristic wavelength. It is important that the mask be reflective at the characteristic wavelength and that the photoactive element be responsive to the characteristic wavelength.

The preferred embodiment has been described in the context of projection lithography, but it is also advantageous to use the energy-efficient techniques and mechanism disclosed in the invention in contact, proximity, and in-situ lithography. In these cases, respectively, there is a reflective layer in contact with, near, or integral with a target surface. FIG. 5 shows an arrangement similar to that in FIG. 2, where the projection mask is replaced with an in-situ mask 70 coated directly on the substrate 72. The incident radiation 46 is reflected from the mask coating 70 as ray 68. The radiation not reflected by the coating is absorbed by the substrate 72, producing, in this case, a via 74 by photo-ablation. In this implementation, it is advantageous to make the reflective mask coating with multiple dielectric layers optimized for high reflectivity at the characteristic wavelength of the radiation source 22.

Theoretical Analysis

We now estimate the enhancement possible in the exposure efficiency of a projection system by this mechanism. For this analysis, a circular homogenizing tube is used with a unit magnification condenser lens. This analysis may be applied to homogenizers with any desired cross-sectional shape. Similarly, the condenser lens may be used at any magnification. Let $I_0$=the initial intensity of the beam (44) as it enters the homogenizer, and $I_1$=the intensity of the beam (46) initially incident on the mask.

The average intensity of the beam initially incident upon the mask will depend upon the number of reflections in the homogenizer, the reflectivity of the homogenizer surface, and the transmittances of the condenser lens surfaces. Different portions of the fan of rays entering the homogenizer encounter different numbers of reflections. An effective reflectivity for the homogenizer can be found by grouping the rays by the number of reflections encountered. The reflection loss for each set of rays is found, and all of the components are combined to give an effective reflectance. As shown in FIG. 6(a), the maximum solid angle, $\Omega$, for the incident rays is given by (for small values of $\Omega$):

$$\Omega_{max} \approx \pi \left( \frac{r_h}{l_h(2N+1)} \right)^2, \quad (1)$$

where $r_h$= the radius of the homogenizer tube, $l_h$=the length of the homogenizer, and N is the maximum number of reflections. For n or less reflections, the solid angle is given by:

$$\Omega_{0..n} \approx \pi(2n+1)^2 \left( \frac{r_h}{l_h} \right)^2 \quad (2)$$

An example is given in FIG. 6(b) for two or less reflections. The ratio of the number of rays with n reflections only to the total number of rays can then be written (for n>1):

$$\frac{\Omega_n}{\Omega_{max}} \approx \frac{\pi(2n+1)^2 \left( \frac{r_h}{l_h} \right)^2 - \pi(2(n-1)+1)^2 \left( \frac{r_h}{l_h} \right)^2}{\pi(2N+1)^2 \left( \frac{r_h}{l_h} \right)^2} = \quad (3)$$

$$\frac{8n}{(2N+1)^2} \; ; n > 1.$$

Thus, the intensity initially incident upon the mask can be obtained by summing Eqn. (3) for values of n from 0 to N, and is given by: [where $R_h$ is the homogenizer reflectance for a single reflection, T is the transmittance of each surface in the condenser lens, and S is the number of surfaces.]

$$I_1 = \frac{I_0 T^S}{(2N+1)^2} \left[ 1 + 8 \sum_{n=1}^{N} n R_h^n \right]. \quad (4)$$

The effective reflectance, $R_v$, of the mask surface containing the via pattern can be given by:

$$R_v = VR_m + (1-V)R_c, \text{ where } V = \frac{n_v d_v^2}{m^2 d_h^2}. \quad (5)$$

$R_m$ is the uncoated mask reflectance, and $R_c$ is the reflectance of the high-reflectivity coating surrounding the vias. Note that V is a factor describing the ratio of the mask transmitting area to the reflecting area in terms of the number of vias, $n_v$; the via diameter, $d_v$; the homogenizer diameter, $d_h$; and the magnification of the condensing lens, m.

The intensity inside the mask is given by $I_2$, and $I_3$ describes the intensity of the beam emerging from the mask after the first pass;

$$\begin{aligned} I_2 &= (1-R_m)I_1 \quad (6) \\ I_3 &= (1-R_v)I_2 \\ &= (1-R_m)(1-R_v)I_1 \\ &= I_0(1-R_m)(1-R_v)\frac{T_s^4}{(2N+1)^2}\left[1+8\sum_{n=1}^{N}nR_h^n\right]. \end{aligned}$$

Now, the intensity returning toward the homogenizer from the mask, given by $I_4$, comes from two terms—the light reflected from the bottom (uncoated) surface, and the light reflected from the top surface:

$$\begin{aligned} I_4 &= R_m I_1 + (1-R_m)R_v I_2 \quad (7) \\ &= I_1[R_m + (1-R_m)^2 R_v]. \end{aligned}$$

This beam passes through the condenser lens and into the homogenizer. The light not passing through the hole in the back reflecting surface will be reflected and will pass once again through the homogenizer to the mask. The returning beam effectively passes through a homogenizer of twice the length before returning through the condenser lens to the mask. The same ratios for the solid angles of the different reflection components of the ray bundle apply as before, where the homogenizer length has doubled. The intensity incident upon the mask on the second pass can then be written, accounting also for two trips through the condenser lens, and using a factor $R_a$ as the reflectance of the back reflector:

$$I_5 = I_4 \frac{R_a T^{2S} A}{(4N+1)^2}\left[1+8\sum_{n=1}^{2N}nR_h^n\right]. \quad (8)$$

$$\text{where } A = \frac{A_{reflector} - A_{aperture}}{A_{reflector}}.$$

Hence, the effective reflectivity for the back-reflected beam is given by:

$$R_{eff} = \frac{I_5}{I_1} \quad (9)$$

$$R_{eff} = [R_m + (1-R_m)^2 R_v]\frac{R_a T^{2S} A}{(4N+1)^2}\left[1+8\sum_{n=1}^{2N}nR_h^n\right].$$

The total effect of recycling the energy can be found by finding the sum of the geometric series:

$$I_{tot} = I_1(1 + R_{eff} + R_{eff}^2 + R_{eff}^3 + \ldots) = \frac{I_1}{1-R_{eff}}. \quad (10)$$

Performance Projection

Table 1 gives representative values for the variables appearing in Eqn. 9 using a 1 inch diameter homogenizing tube, with a 0.08 inch diameter hole. The results of the calculation for homogenizers with at most two and three reflections are given in Table 2.

For this example, as a result of recycling as described in this invention, Table 2 shows that the effective exposure energy incident on the substrate will be 5.1 times greater than if the light reflected from the mask were lost for the case of at most two reflections per pass in the homogenizer. This advantage will therefore result in significantly greater processing throughput. Alternatively, for the same throughput, one may use a laser source of much smaller power output, which will reduce the system cost as well as operating costs.

TABLE 1

Estimated Variable Values for Sample Calculation

| Variable Description | Variable | Est. Value |
|---|---|---|
| Mask reflectivity (uncoated) | $R_m$ | 0.04 |
| Homogenizer reflectivity (at high angle) | $R_h$ | 0.97 |
| Aperture reflectivity | $R_a$ | 0.995 |
| Number of lens surfaces in condenser | S | 4 |
| Transmittance of lens surfaces | T | 0.995 |
| Via factor | V | 0.01 |
| Coating Reflectivity | $R_c$ | 0.97 |
| Effective Reflectivity of Mask Pattern | $R_v$ | 0.96535 |
| Ratio of used area of back reflector to total | A | 0.9936 |
| Homogenizer radius | $r_h$ | 0.5 |
| Aperture radius | $r_a$ | 0.04 |

TABLE 2

Effective Reflectivity Intensity Increase for a Homogenizer with at Most Two and Three Reflections

| Maximum number of reflections in single pass, N | 2 | 3 |
|---|---|---|
| Total Effective Reflectivity, $R_{eff}$ | 0.803 | 0.772 |
| Intensity Multiplication Factor | 5.088 | 4.380 |

An important feature of this technique is that the homogenization and recycling of radiation reflected from the mask coating is performed while maintaining the illumination numerical aperture. It is important to appropriately match the numerical aperture, or convergence angle, of the illuminating radiation, to the numerical aperture accepted by the projection lens. The condenser lens can be designed to give a cone of illumination that is normally incident upon the mask for each point in the field of view (telecentric condition); this ensures that the reflected radiation is always within the maximum desired numerical aperture and will always return through the optical system. Other methods of homogenization which do not preserve numerical aperture, such as microlens arrays and diffusers, are not appropriate for this recycling scheme.

This technique for energy recycling will also provide greater beam homogeneity. The reflected components effectively traverse a homogenizer tube of twice the length. Since there is a double pass after each reflection from the mask and each component contributes to the total illumination, the transverse spatial uniformity of the beam will be improved.

Numerical Analysis

A numerical analysis has also been performed using optical design software to show that the back-reflected radiation from the coated mask surface will be reflected back towards the mask. For this analysis, both circular and hexagonal homogenizing tubes have been modeled. For the circular homogenizer, a radius of 0.5 inches was chosen with a 0.04 inch radius circular aperture at the input of the homogenizer, as in the example calculations given in Tables 1 and 2. The hexagonal tube was modeled with 8 mm sides and a square input aperture 0.08×0.08 inches. In each case, the length of the homogenizer was chosen to give a maximum of two reflections for a single pass through the homogenizer. A similar analysis could easily be applied to homogenizing tubes with other cross-sectional shapes or apertures.

The first reflection from the coated mask surface can be modeled on an optical design program by tracing a grid of rays from the focus at the input of the homogenizer through the homogenizer and condenser lens to the mask, and continuing through an identical condenser lens and homogenizer used in reverse. The hole in the back-reflecting device is modeled as an obscuration to the rays.

FIGS. 7(a) and 7(b) show the pattern of ray intersection points at the reflective surface 32 on the input aperture 30, after the rays have passed through the homogenizer and condenser lens, reflected off the coated mask surface 48, and returned through the condenser and homogenizer. FIG. 7(a) shows the ray intersection pattern on the reflecting aperture 32 for the 0.5 inch radius circular homogenizing tube. FIG. 7(b) shows the pattern on the aperture for the hexagonal homogenizer. In both cases, the majority of the rays are seen to strike the reflective surface 32 surrounding the aperture 30. The small blank area at the center of each figure represents the hole in the reflecting aperture.

Both plots show that the beam reflected from the mask back through the system into the homogenizer will produce very uniform illumination on the back reflecting aperture at the input of the homogenizer and will be substantially reflected back towards the mask, increasing the intensity as described by the theoretical treatment above, as well as improving intensity uniformity at the mask. Some structure to the ray patterns is discernable; this is simply an artifact of the computer modeling that depends on the finite number of rays traced by the optical design program and the grid of rays used.

The invention has been shown and described in the job of drilling via-holes in multilayer circuit devices, and in precision exposure applications such as are used in integrated circuit production, but it will be apparent that other applications and variations in method and hardware are within the spirit and scope of the invention, as stated in the following claims.

What we claim is:

1. An energy-efficient exposure system for producing a pattern on a target substrate, comprising:
   a) a radiation source (22);
   b) optical imaging means for operatively presenting an image of a selected portion of the pattern on a target substrate (12/72), having an optical imaging path between said radiation source and the target substrate (12/72);
   c) an optical intensity homogenizer (34) in said optical imaging path, comprising a cylinder with an entry port, a highly reflective interior surface, and an exit port, for enhancing the uniformity of radiation entering the homogenizer, by multiple reflections from said interior reflective surface;
   d) reflective mask means (10/70) mounted optically downstream from said homogenizer exit port, having transmitting areas and reflective areas defining the pattern, which selectively passes radiation through the transmitting areas to selected areas of said target substrate (12/72), and reflects radiation from said reflecting areas, whereby a significant portion of such reflected radiation re-enters said homogenizer through its exit port and re-traverses the cylinder of said homogenizer to its entry port; and
   e) means for recycling homogenizer radiation, comprising an apertured reflector (30) having a source side and a mask side, having a radiation-transmitting entry aperture (31) for accepting radiation from said radiation source (22) in a forward direction, and having a reflective surface (32) on the mask side to reflect in a forward direction the radiation which is incident upon said reflective surface (32) after being reflected by said mask and re-traversing said homogenizer (34) in a backward direction.

2. An exposure system according to claim 1, in which said optical intensity homogenizer (34) cylinder is circular in cross section.

3. An exposure system according to claim 1, in which said optical intensity homogenizer (34) cylinder is hexagonal in cross section.

4. An exposure system according to claim 1, in which said optical intensity homogenizer (34) cylinder is square in cross section.

5. An exposure system according to claim 1, in which said optical homogenizer (34) cylinder is a solid piece of optically transparent material in which multiple reflections take place by total internal reflection.

6. An exposure system according to claim 1, in which said optical intensity homogenizer (34) cylinder is a hollow cylinder with a single highly reflective interior surface.

7. An exposure system according to claim 1, in which said optical intensity homogenizer (34) cylinder is a hollow cylinder with multiple highly reflective interior surfaces.

8. An exposure system according to claim 7, in which said cylinder is formed as an assembly of highly reflective mirror strips.

9. An exposure system according to claim 1, in which said entry aperture (31) of said apertured reflector (30) is a physical opening.

10. An exposure system according to claim 1, in which said entry aperture (31) of said apertured reflector (30) is an optically transparent region.

11. An exposure system according to claim 1, in which said radiation source (22) has a characteristic wavelength and in which all reflective surfaces are optimized for high reflectivity at said characteristic wavelength and all transmissive surfaces are optimized for high transmissivity at said characteristic wavelength.

12. An exposure system according to claim 1, in which the incident source radiation entering said optical intensity homogenizer (34) through said apertured reflector (30) has a characteristic numerical aperture, and said homogenizer (34) preserves such characteristic numerical aperture for radiation traversing both forward toward said mask (10/70) and backward toward said apertured reflector (30).

13. An energy-efficient exposure system for producing a via-hole pattern in a target substrate, comprising:

a) a high-energy radiation source (22);

b) optical imaging means for operatively presenting an image of a selected portion of the via-hole pattern on a target substrate (12/72), having an optical imaging path between said radiation source (22) and the target substrate (12/72);

c) an optical intensity homogenizer (34) in said optical imaging path, comprising a cylinder with an entry port, an interior reflective surface, and an exit port, for enhancing the uniformity of radiation entering the homogenizer, by multiple reflections from said interior reflective surface;

d) reflective mask means (10/70) mounted optically downstream from said homogenizer exit port, having transmitting areas and reflective areas defining the via-hole pattern, which selectively passes radiation through the transmitting areas to selected areas of said target substrate (12/72), enabling direct removal of target material in the selected areas thus exposed to produce the via-hole pattern, and reflects radiation from said reflecting areas, whereby a significant portion of such reflected radiation re-enters said homogenizer through its exit port and re-traverses the cylinder of said homogenizer to its entry port; and e) means for recycling homogenizer radiation, comprising an apertured reflector (30) having a radiation-transmitting entry aperture for accepting radiation from said radiation source (22) in a forward direction through said entry aperture and having a reflective layer (32) on the surface surrounding the aperture on the side opposite said radiation source (22), to reflect in a forward direction radiation reflected from reflective mask (10/70) after such radiation has re-traversed said homogenizer (34).

14. An exposure system according to claim 1, comprising in addition:

f) a pre-imaging homogenizer output aperture element (36), having a transmissive aperture (37) which forms a radiation pattern of a selected shape at the exit port of said homogenizer (34), and having a reflective surface (38) which reflects radiation back in a reverse direction through said homogenizer (34) toward said apertured reflector (30) for recycling.

15. An exposure system according to claim 14, in which said transmissive aperture (37) forms a radiation pattern of a hexagonal shape.

16. An exposure system according to claim 14, in which said transmissive aperture (37) forms a radiation pattern of a quadrilateral shape.

17. An exposure system according to claim 14, in which said transmissive aperture (37) forms a radiation pattern of a circular shape.

18. An exposure system according to claim 14, in which said transmissive aperture (37) forms a radiation pattern of an irregular polygonal shape.

19. An exposure system according to claim 14, in which said transmissive aperture (37) forms a radiation pattern of shape which is at least partially made of curved sides.

20. An exposure system according to claim 1, in which said reflective mask means (70) is an in-situ mask integral with said target substrate (72).

21. An exposure system according to claim 1, in which said reflective mask means (70) is held in contact with said target substrate (72).

22. An exposure system according to claim 1, in which said reflective mask means (70) is held in non-contact proximity to said target substrate (72).

23. An exposure system according to claim 20, in which said radiation source (22) has a characteristic wavelength, and in which said in-situ reflective mask means (70) comprises multiple layers of dielectric material optimized for high reflectivity to radiation at the characteristic wavelength of said radiation source.

24. An exposure system according to claim 20, comprising, in addition:

f) a pre-imaging homogenizer output aperture element (36) having a transmissive aperture (37) which forms a radiation pattern of a selected shape at the exit port of said homogenizer (34) and having a reflective surface (38) which reflects radiation back in a reverse direction through said homogenizer (34) toward said apertured reflector (30) for recycling.

25. An exposure system according to claim 21, comprising, in addition:

f) a pre-imaging homogenizer output aperture element (36) having a transmissive aperture (37) which forms a radiation pattern of a selected shape at the exit port of said homogenizer (34) and having a reflective surface (38) which reflects radiation back in a reverse direction through said homogenizer (34) toward said apertured reflector (30) for recycling.

26. An exposure system according to claim 22, comprising, in addition:

f) a pre-imaging homogenizer output aperture element (36) having a transmissive aperture (37) which forms a radiation pattern of a selected shape at the exit port of said homogenizer (34) and having a reflective surface (38) which reflects radiation back in a reverse direction through said homogenizer (34) toward said apertured reflector (30) for recycling.

27. An energy-recycling optical intensity homogenizer (34) comprising:

a) a hollow cylinder with reflective interior surfaces, an entry port and an exit port; and b) apertured reflector means (30) at said entry port, said reflector means (30) having an optical aperture (31) and a reflective surface (32) substantially complementary to said aperture (31) and facing said exit port.

28. An energy-recycling optical intensity homogenizer (34) according to claim 27, in which said reflective surfaces are optimized for a characteristic wavelength.

29. An energy-recycling optical intensity homogenizer (34) according to claim 27, comprising, in addition:

c) a pre-imaging mask (36) with an optical aperture (37) of a selected polygonal pattern and with a reflective surface (38) substantially complementary to said aperture (37) and facing said entry port.

30. An energy-recycling optical intensity homogenizer (34) according to claim 29, in which said reflective surfaces are optimized for a characteristic wavelength.

* * * * *